(12) United States Patent
Pan et al.

(10) Patent No.: US 8,686,783 B2
(45) Date of Patent: Apr. 1, 2014

(54) LEVEL SHIFTER AND BOOST DRIVING CIRCUIT

(75) Inventors: Hsuan-I Pan, Taipei (TW); Guo-Kiang Hung, New Taipei (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 219 days.

(21) Appl. No.: 13/231,195

(22) Filed: Sep. 13, 2011

(65) Prior Publication Data

US 2012/0313669 A1  Dec. 13, 2012

(30) Foreign Application Priority Data

Jun. 9, 2011 (TW) .............................. 100120262 A

(51) Int. Cl.
*H03L 5/00* (2006.01)
(52) U.S. Cl.
USPC .......................................................... 327/333
(58) Field of Classification Search
None
See application file for complete search history.

(56) References Cited

U.S. PATENT DOCUMENTS

| 7,961,028 | B2* | 6/2011 | An et al. ........................ 327/333 |
| 7,973,561 | B2* | 7/2011 | vanRuymbeke et al. ....... 326/82 |
| 8,102,124 | B2* | 1/2012 | Hung et al. .................... 315/127 |
| 8,134,385 | B2* | 3/2012 | Gwinn ............................ 326/30 |
| 8,264,272 | B2* | 9/2012 | Zhang et al. ................... 327/433 |
| 2006/0192605 | A1* | 8/2006 | Suzuki et al. .................. 327/333 |

* cited by examiner

*Primary Examiner* — Lincoln Donovan
*Assistant Examiner* — Khareem E Almo
(74) *Attorney, Agent, or Firm* — Edell, Shapiro & Finnan, LLC

(57) ABSTRACT

A level shifter and an associated booster driving circuit are provided. The level shifter includes an input stage and an output stage. The input stage includes an input switch, which receives an input signal and is selectively turned on according to the input signal. The output stage outputs a gate driving signal. The gate driving signal is at a low logic level when the input switch is turned on, and is at a high logic level when the input switch is turned off. The logic level of the input signal is substantially the same as the logic level of the gate driving signal.

10 Claims, 2 Drawing Sheets

LEVEL SHIFTER AND BOOST DRIVING CIRCUIT

This application claims the benefit of Taiwan application Serial No. 100120262, filed Jun. 9, 2011, the subject matter of which is incorporated herein by reference.

BACKGROUND OF THE INVENTION

1. Field of the Invention

The invention relates in general to a level shifter, and more particularly, to a level shifter configured to prevent erroneous or inadvertent turning on of a power switch thereof.

2. Description of the Related Art

In a liquid crystal display (LCD) television monitor, a low operating voltage, e.g., 3.3V, may be used for a scaler in an effort to save power and chip area. However, a backlight source of the LCD TV monitor may be a light-emitting diode (LED) or a cold-cathode fluorescent lamp (CCFL) that operates at a much higher voltage, e.g., up to 40V. In many cases a power converter is employed to convert an operating voltage to another operating voltage.

A commonly used power converter is a switch-mode power supply (SMPS) due to its excellent power conversion efficiency. As implied by its name, an SMPS comprises a power switch for controlling energy storage or discharge of an inductance element so as to achieve power conversion.

It is to be noted that such a power switch needs to withstand a rather high voltage and thus a threshold voltage of a control gate of the power switch is correspondingly high. A signal generated by a scaler with a 3.3V operating voltage mostly probably has a maximum voltage of 3.3V, which is insufficient for driving a control gate of a common power switch. Hence, in order to drive a power switch, a level shifter or a driver is required to convert a 3.3V driving signal output by a scaler to a gate driving signal of a voltage system with a higher voltage.

When designing a level shifter, it is important to consider not only a power-on sequence but also prevention of erroneous turning on of a power switch. An inductance element may become saturated and lead to a hazardous condition in a case where, e.g., a power switch is erroneously turned on during the power-on sequence.

SUMMARY OF THE INVENTION

According to an aspect the present invention, a level shifter comprises a common-base amplifier and a current amplifier. The common-base amplifier comprises a first bipolar-junction transistor, which has a base coupled to a first predetermined voltage, an emitter receiving an input signal and a collector coupled to a first voltage source. The current amplifier is voltage supplied by the first voltage source, and comprises an input end coupled to the collector of the first bipolar-junction transistor and an output end for outputting a gate driving signal. The first predetermined voltage is generated with voltage supplied by the first voltage source, and the input signal is generated with voltage supplied by a second voltage source. The second voltage source is a low voltage source compared to the first voltage source.

According to another aspect the present invention, a level shifter comprises an input stage and an output stage. The input stage comprises an input stage switch, which receives an input signal and is selectively turned on according to the input signal. The output stage is serially connected to the input stage, and outputs a gate driving signal. The gate driving signal is at a low logic level when the input switch is turned on, and is at a high logic level when the input switch is turned off. The logic level of the input signal is substantially the same as the logic level of the gate driving signal.

According to yet another aspect the present invention, a booster driving circuit is provided. The booster driving circuit comprises a first voltage source, a low dropout regulator (LDO), a scaler, a level shifter, and a booster. The LDO receives the first voltage source to generate a second voltage source. Compared to the first voltage source, the second voltage source is a low voltage source. The scaler receives the second voltage source, and comprises a gate pre-driver for providing an input signal. The level shifter is coupled to the gate pre-driver, and comprises an input stage and an output stage. The input stage receives the input signal, and the output stage is serially connected to the input stage and outputs a gate driving signal. The input stage and the output stage respectively receive a plurality of reference voltages generated with voltage supplied by the first voltage source. The input signal is generated with voltage supplied by the second voltage source. When a voltage supplied by the first voltage source increases to a predetermined operating voltage, a logic level of the input signal is substantially the same as a logic level of the gate driving signal. The booster comprises a power switch, which is coupled to the level shifter and receives the gate driving signal to output a driving voltage.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
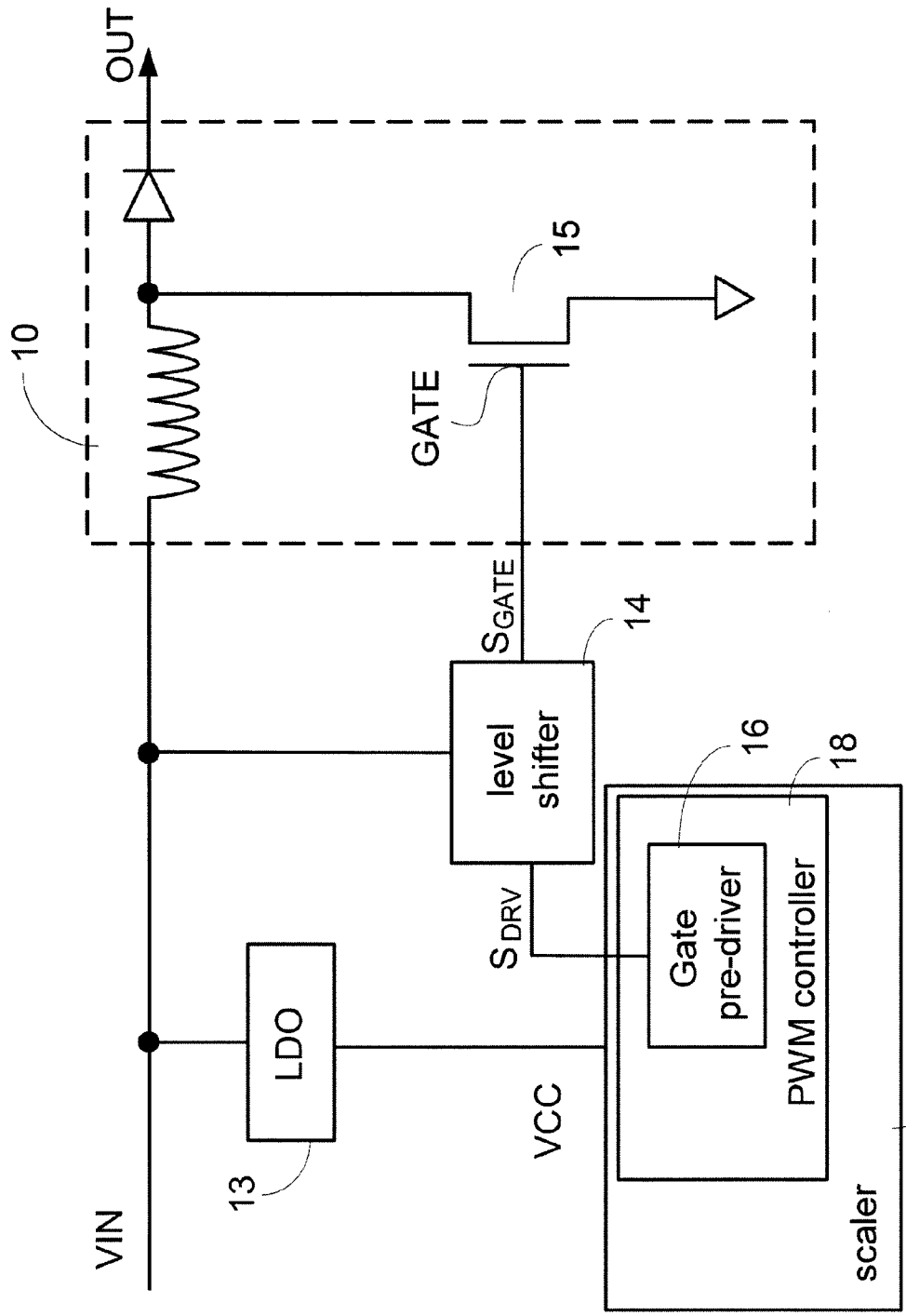
FIG. 1 is a perspective view of a display.

FIG. 1 shows a perspective view of a circuit suitable for an LCD monitor according to an embodiment of the present invention. An input voltage source VIN, e.g., 12V, serves as a major voltage source of the entire circuit. A booster 10 provides a higher voltage source at an output end OUT to serve as a driving voltage of backlight. For example, the higher voltage may be 40V for driving a plurality of LED chains. A low dropout regulator (LDO) 13 generates a voltage source VCC to supply voltage to a scaler 20. As far as a power-on sequence is concerned, only when the voltage source VIN is almost ready (e.g., when a voltage level of the voltage source is quite high as approaching 12V), does the LDO 13 start to gradually increase the voltage source VCC from 0V to 3.3V to drive and operate the scaler 20.

For example, the scaler 20 may be a monolithic chip including a pulse-width modulation (PWM) controller 18 for controlling a duty ratio of a power switch 15 in the booster 10. The PWM controller 18 includes a gate pre-driver 16. The gate pre-driver 16 generates a driving signal $S_{DRV}$ with voltage supplied by the voltage source VCC, and the driving signal $S_{DRV}$ is hence of a 3.3V system as determined by the voltage source VCC. In other words, a logic level of the driving signal $S_{DRV}$ is between 0V and 3.3V. For example, the driving signal $S_{DRV}$ has a low logic level of 0V and a high logic level of 3.3V.

The level shifter 14 is coupled between the gate pre-driver 16 and the power switch 15. The level shifter 14 drives a control gate GATE of the power switch 15 and at the same time the level shifter 14 receives the driving signal $S_{DRV}$ of the 3.3V system to generate a gate driving signal $S_{GATE}$ of a 12V system. For example, the gate driving signal $S_{GATE}$ has a low logic level of 0V and a high logic level of approximately 11V.

Figure 2:
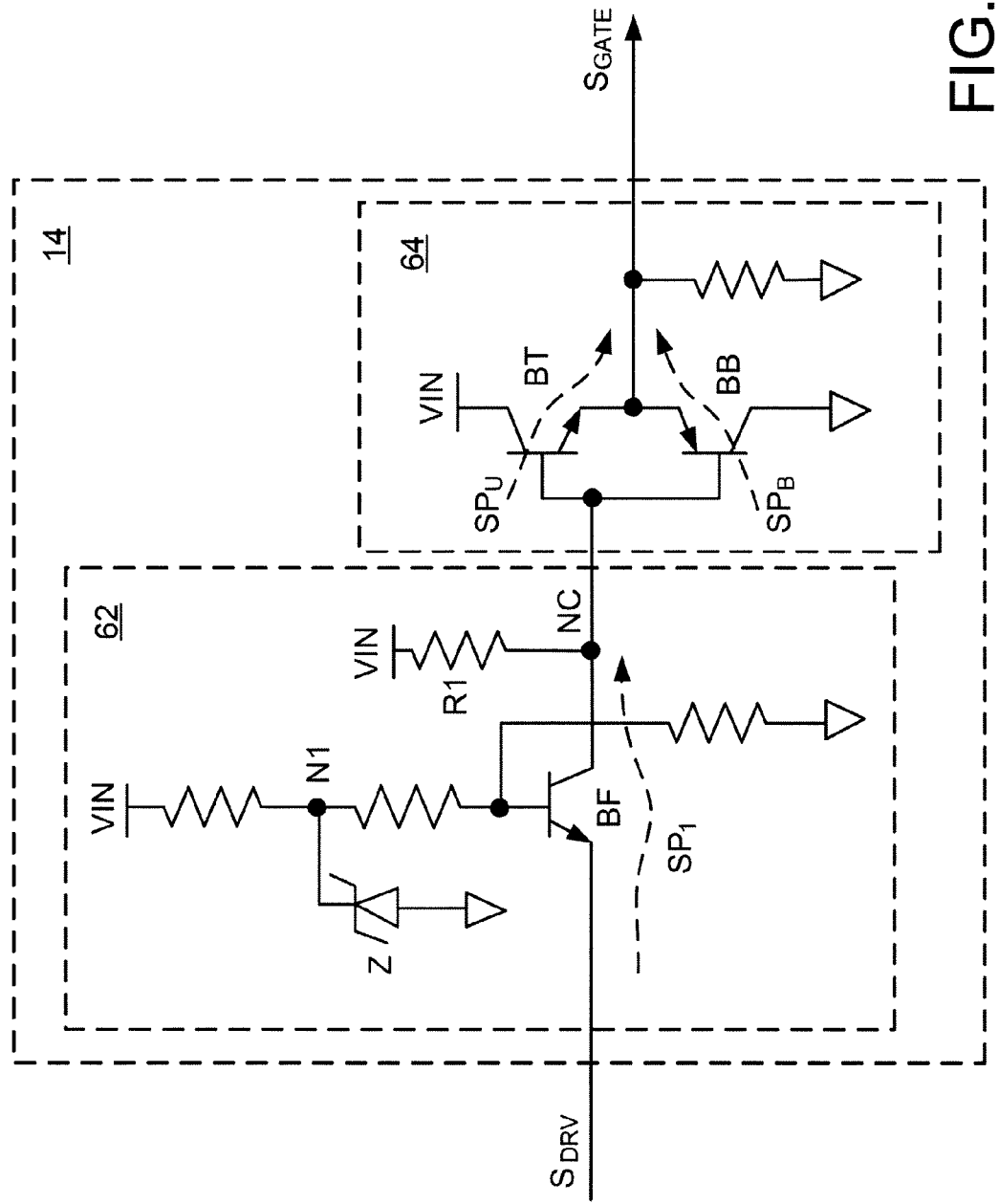
FIG. 2 is a detailed circuit schematic diagram of a level shifter shown in FIG. 1.

FIG. 2 is a detailed circuit schematic diagram of the level shifter 14 in FIG. 1. The level shifter 14 includes an input stage 62 and an output stage 64, and may be assembled from discrete devices. As can be seen from FIG. 2, apart from the 3.3V driving signal $S_{DRV}$ serving as an input signal, all other signals from reference signals to input/output signals in the level shifter 14 are generated by the 12V voltage source VIN, and are independent from the 3.3V voltage source VCC in FIG. 1. An advantage of such a design is that, even when that the voltage source VCC supplying voltage to the driving signal $S_{DRV}$ is not yet ready (i.e., the voltage is not yet raised from 0V to a voltage near 3.3V), the level shifter 14 is stabilized as long as the voltage source VIN is stable and is ready to generate the corresponding gate driving signal $S_{GATE}$ according to the driving signal $S_{DRV}$.

The input stage 62 is a common-base amplifier, including an NPN bipolar-junction transistor BF. The bipolar-junction transistor BF serves as an input stage switch, and has its emitter receiving the driving signal $S_{DRV}$. When the voltage source VIN is stable, a clamping voltage of a Zener diode Z sets or provides a voltage at a node N1, meaning that a voltage of the bipolar-junction transistor BF is approximately determined. A collector (i.e., a node NC) of the bipolar-junction transistor BF is coupled to the 12V voltage source VIN via a resistor R1. When the driving signal $S_{DRV}$ is at a low logic level, e.g., 0V, the bipolar-junction transistor BF is turned on and operates at a saturation state, and thus the node NC is at a very low voltage, e.g., 0.2V. When the driving signal $S_{DRV}$ is at a high logic level, e.g., 3.3V, the bipolar-junction transistor BF is turned off and operates at a cut-off state, and so the node NC is pulled up by the resistor R1 to a very high voltage, possibly approaching 12V of the voltage source VIN. Therefore, the signal at the node NC at this point is of the 12V system determined by the voltage source VIN.

As shown in FIG. 2, the output stage 64 is a push-pull emitter follower. An NPN bipolar-junction transistor BT and a PNP bipolar-junction transistor BB have their bases connected to serve as an input end connected to the node NC, their emitters connected to serve as an output end for outputting the gate driving signal $S_{GATE}$, and their collectors respectively coupled to the voltage source VIN and ground. A voltage level of the gate driving signal $S_{GATE}$ approximately follows a voltage level of the node NC. Therefore, the gate driving signal $S_{GATE}$ is also of a 12V system. The output stage 64 amplifies a current inputted from the node NC to generate an amplified current to be outputted from the emitter of the bipolar-junction transistor BT or the PNP bipolar-junction transistor. Thus, the output stage 64 may be regarded as a current amplifier.

It is concluded from the above description that, the logic level of the gate driving signal $S_{GATE}$ is consistent with that of the driving signal $S_{DRV}$. For example, when the driving signal $S_{DRV}$ is logic 0, its voltage is at a low logic level (0V), and the voltage of the gate driving signal $S_{GATE}$ is also at another low logic level (0V) that is logic 0; when the driving signal $S_{DRV}$ is logic 1, its voltage is at a high logic level (3.3V), and the voltage of the gate driving signal $S_{GATE}$ is also at another high logic level (possibly 11 V) that is logic 1.

In an embodiment, a driving circuit comprises roughly an input stage and an output stage. Each signal path of each stage comprises merely an active element. For example, a signal path $SP_1$ of the input stage 62 in FIG. 2 only comprises the active bipolar-junction transistor BF; two signal paths $SP_B$ and $SP_U$ of the output stage 64 respectively pass through the bipolar-junction transistor BT and the bipolar-junction transistor BB. In another embodiment, a driving circuit may have at least a buffer stage provided between an input stage and an output stage. Due to considerations of reducing signal delay as well as minimizing cost and number of elements, a driving circuit comprising only an input stage and an output stage is preferred.

In the event that the voltage source VIN is not yet stable, the Zener diode Z approximately stabilizes the base voltage of the bipolar-junction transistor at a constant voltage as long as the voltage of the voltage source VIN exceeds the clamping voltage (a predetermined operating voltage) of the Zener diode, so as to ensure that the bipolar-junction transistor BF operates at the saturation state from the beginning to maintain the node NC at a relatively low voltage. Thus, during a power-on sequence, the node NC is maintained at a relatively low voltage from the beginning. Not until the voltage source VCC is ready and the voltage level of the driving signal $S_{DRV}$ has been raised, is the voltage at the node NC possibly raised.

The level shifter 14 offers several advantages. First of all, erroneous operations in a power-on sequence are prevented. The level shifter 14 needs voltage supplied by the single voltage source VIN to generate all reference voltages and operating nodes. As previously described, the Zener diode Z stabilizes the base voltage of the bipolar-junction transistor at a constant voltage as long as the voltage of the voltage source VIN exceeds the clamping voltage (a predetermined operating voltage) of the Keener diode, so as to ensure that the bipolar-junction transistor BF operates at a saturation state from the beginning to maintain the node NC at a relatively low voltage. The voltage of the driving signal $S_{DRV}$ remains close to 0V in the case where the voltage source VCC is not yet ready to be raised up to 3.3V. At this point, supposing the voltage source VIN is already ready to be at 12V, the level shifter 14 is enabled to operate normally and generates the gate driving signal $S_{GATE}$ of a logic level identical to that of the driving signal $S_{DRV}$. That is, the gate driving signal $S_{GATE}$ has a low voltage, which is approximately a low logic level of the gate driving signal $S_{GATE}$. In this way, the gate driving signal $S_{GATE}$ will not erroneously be at a high logic level.

A second advantage of the level shifter 14 is that it comprises a small number of elements. As shown in FIG. 2, the level shifter 14 only comprises three bipolar-junction transistors, a Zener diode and a plurality of resistors—a small number of elements, which results in low component low cost.

The level shifter 14 further provides another advantage of having a fast operating speed. The bipolar-junction transistor BF of the input stage 62 is NPN operating at a higher speed than a PNP bipolar-junction transistor. In addition, the input stage 64 is a high-speed push-pull emitter follower. Therefore, the level shifter 14 is theoretically capable of operating at a speed at 500 KHz and higher.

Although a circuit of an LCD monitor is taken as an example in the description of the present invention, the present invention is also suitable to other applications that are driving circuits for converting signals of a lower voltage system to signals of a higher voltage system.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A level shifter, comprising:
   a common-base amplifier, comprising a first bipolar-junction transistor having a base coupled to a first predetermined voltage, an emitter receiving an input signal and a collector coupled to a first voltage source; and
   a current amplifier, having voltage supplied by the first voltage source, having an input end coupled to the collector of the first bipolar-junction transistor and an output end for outputting a gate driving signal,
   wherein, the first predetermined voltage is generated with voltage supplied by the first voltage source, and the input signal is generated with voltage supplied by a second voltage source; and the second voltage source is a low voltage source compared to the first voltage source,
   wherein the current amplifier comprises a first emitter follower, the first emitter follower comprising a second bipolar-junction transistor having a collector coupled to the first voltage source, a base coupled to the collector of the first bipolar-junction transistor and an emitter for outputting the gate driving signal, and
   wherein the current amplifier further comprises a second emitter follower, the second emitter follower comprising a third bipolar-junction transistor having a base coupled to the collector of the first bipolar-junction transistor, a collector coupled to ground and an emitter for outputting the gate driving signal.

2. The level shifter according to claim 1, wherein the first bipolar-junction transistor operates at a saturation state when the input signal is at a low logic level, and operates at a cut-off state when the input signal is at a high logic level.

3. The level shifter according to claim 1, wherein the common-base amplifier comprises a Zener diode for providing the first predetermined voltage.

4. A level shifter, comprising:
   an input stage, comprising an input stage switch configured to receive an input signal, the input stage switch selectively turning on according to the input signal; and
   an output stage, serially connected to the input stage, configured to provide a gate driving signal, being at a low logic level when the input stage is turned on and being at a high logic level when the input stage is turned off,
   wherein, a logic level of the input signal is substantially the same as a logic level of the gate driving signal, and
   wherein the input stage comprises a Zener diode and an active element, the Zener diode ensuring that the active element operates at a saturation state when a voltage of the second voltage source is not raised to a predetermined operating voltage.

5. The level shifter according to claim 4, wherein the input stage is a common-base amplifier.

6. The level shifter according to claim 4, wherein the input stage switch is a first bipolar-junction transistor, and the first bipolar-junction transistor operates at a saturation state when the input signal is at a low logic level, and operates at a cut-off state when the input signal is at a high logic level.

7. The level shifter according to claim 4, wherein the output stage is an emitter follower.

8. The level shifter according to claim 4, wherein the output stage is a push-pull emitter amplifier.

9. The level shifter according to claim 4, wherein each signal path of the input stage and the output stage passes through only an active element.

10. A booster driving circuit, comprising:
    a low dropout regulator (LDO), configured to receive a first voltage source to generate a second voltage source, the second voltage source being a low voltage source compared to the first voltage source;
    a scaler, configured to receive the second voltage source, the scaler comprising a gate pre-driver providing an input signal;
    a level shifter, coupled to the gate pre-driver, comprising:
        an input stage, configured to receive the input signal;
        an output stage, serially connected to the input stage, configured to provide a gate driving signal;
        wherein, the input stage and the output stage respectively receive a plurality of reference voltages provided with voltage supplied by the first voltage source; the input signal is generated with voltage supplied by the second voltage source; and a logic level of the input signal is substantially the same as a logic level of the gate driving signal when a voltage supplied by the first voltage source is increased to a predetermined operating voltage; and
    a booster, comprising a power switch coupled to the level shifter, configured to receive the gate driving signal to generate a driving voltage.

* * * * *